United States Patent
Chu

(10) Patent No.: US 6,753,703 B2
(45) Date of Patent: Jun. 22, 2004

(54) RESETABLE CASCADABLE DIVIDE-BY-TWO CIRCUIT

(75) Inventor: Peter F. Chu, Poway, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 122 days.

(21) Appl. No.: 10/114,689

(22) Filed: Apr. 2, 2002

(65) Prior Publication Data

US 2003/0185336 A1 Oct. 2, 2003

(51) Int. Cl.[7] ............................................. H03K 19/086
(52) U.S. Cl. ........................ 326/126; 326/124; 326/93; 326/99
(58) Field of Search ........................... 326/93, 99, 124, 326/126; 327/113, 115, 117, 118; 377/47

(56) References Cited

U.S. PATENT DOCUMENTS 5,948,046 A * 9/1999 Hagberg ..................... 708/103
6,157,693 A * 12/2000 Jayaraman ..................... 377/47

* cited by examiner

*Primary Examiner*—Anh Tran
(74) *Attorney, Agent, or Firm*—John A. Miller; Warn, Burgess & Hoffmann, P.C.

(57) ABSTRACT

A cascadable divide-by-two binary counter circuit (120) that has particular application for use as a synchronous divider circuit (50, 54) in a phase lock loop (26). The counter circuit (120) employs a D flip-flop (122) that receives a D input and provides a Q output. A first AND gate (124) is responsive to a P input and a Q input, where the Q input is the output from a preceding counter circuit and the P input is the state of all of the preceding counter circuits. The output of the AND gate (124) is applied to an exclusive-OR gate (126) along with the Q output of the flip-flop (122). The output of the exclusive-OR gate (126) is applied to one input of a second AND gate (128). The other input of the second AND gate (128) is a reset signal and the output of the second AND gate (128) is the D input of the flip-flop (122). A decoder (142) is programmed to provide the reset signal when the desired count is reached.

20 Claims, 6 Drawing Sheets

RESETABLE CASCADABLE DIVIDE-BY-TWO CIRCUIT

BACKGROUND OF THE INVENTION

1. Field of the Invention

This invention relates generally to a cascadable, synchronous divide-by-two counter and, more particularly, to a cascadable, synchronous divide-by-two counter that employs bipolar transistors in a low power and low cost mixed-signal device.

2. Discussion of the Related Art

Cellular telephone base stations employ several RF transmitter and receiver circuits for processing cellular telephone signals. Cellular telephone signals transmitted from a mobile unit are received by a receiver circuit in the base station, and demodulated and processed therein to decode the signal. The decoded signal is then transferred to a land line or to a transmitter circuit in the base station. The transmitter circuit modulates the information to be transmitted onto a carrier wave for transmission. The transmit and receive signals are typically at a frequency in the range of 800–2000 MHz, where the transmit signal and the receive signals are at different frequencies within a given frequency band with a fixed offset between the signals.

Each receiver circuit typically employs two channels, a primary channel and a diversity channel, each having a separate antenna, so that the receiver circuit can select which of the two receive signals is the strongest for subsequent processing. Some receiver circuits combine the primary channel and diversity channel signals for increased performance. This allows the receiver to be more reliable by lessening the chance that cellular calls are dropped. However, receivers of this type have been limited in their effectiveness for reducing circuit components, while maintaining signal fidelity at high frequencies.

A key function in a cellular telephone system of the type discussed above is the ability to test that the transmitter circuit is operating properly and producing a signal compatible with system requirements. This is commonly done by "looping" a transmit signal back to the receiver circuit in the system to verify that the transmitter and the receiver are operating properly. Because the transmit signal and the receive signal are at different frequencies, a special RF loop-back self-test circuit is required to convert the transmit signal to the receive signal frequency so that the loop-back test can be performed without disturbing the on-going transceiver operation.

Known RF loop-back self-test circuits typically require a separate phase lock loop (PLL) circuit to generate a local oscillator (LO) signal that provides the offset between the transmit signal frequency and the receive signal frequency. The PLL circuit includes various amplifiers and other system components that are compatible with the system requirements. Further, the known self-test circuits require a mixer circuit to convert the signal to an intermediate frequency (IF), or IF to RF. The known loop-back self-test circuits required many integrated circuits and discrete parts, i.e., separate mixers, buffer amplifiers, switches, voltage controlled oscillators, PLLs, to generate the LO signal and switching at significant cost and size. Further, the known self-test circuit designs are typically point designs that do not have the flexibility to change divide ratios and modes of operation to tune the LO frequency by software control for the different frequency offsets between the transmit and receive signals in the many different base stations.

SUMMARY OF THE INVENTION

In accordance with the teachings of the present invention, a cascadable, synchronous divide-by-two binary counter circuit is disclosed that has particular application for use in a divider circuit in a phase lock loop, for example, a phase lock loop in a loop-back self-test circuit. The divider circuit would include the number of binary counter circuits necessary to provide the desired count based on $2^n$.

The counter circuit employs a D flip-flop that receives a D input and provides a Q output. A first AND gate is responsive to a logic P input and a logic Q input, where the Q input is the output from a preceding counter circuit and the P input is the state of all of the preceding counter circuits. The P input for a particular counter circuit is a logic high only if the P outputs from all of the preceding counters are a logic high. The output of the first AND gate is applied to an exclusive-OR gate along with the Q output of the flip-flop. The output of the exclusive-OR gate is applied to one input of a second AND gate. The other input of the second AND gate is a reset signal, and the output of the second AND gate is the D input of the flip-flop. Each clock transition causes the flip-flop to transfer the D input to the Q output. Each separate counter circuit in the cascade is reset by the same reset signal, and a decoder is programmed to provide the reset signal when the desired count is reached.

Additional objects, advantages and features of the present invention will become apparent from the following description and appended claims, taken in conjunction with the accompanying drawings.

DETAILED DESCRIPTION OF THE EMBODIMENTS

The following discussion of the embodiments of the invention directed to a loop-back self-test circuit and its associated components are merely exemplary in nature, and are in no way intended to limit the invention or its applications or uses. Particularly, the discussion below concerns a self-test circuit for a cellular telephone base station.

However, as will be appreciated by those skilled in the art, the self-test circuit of the invention has application for other systems.

Figure 1:
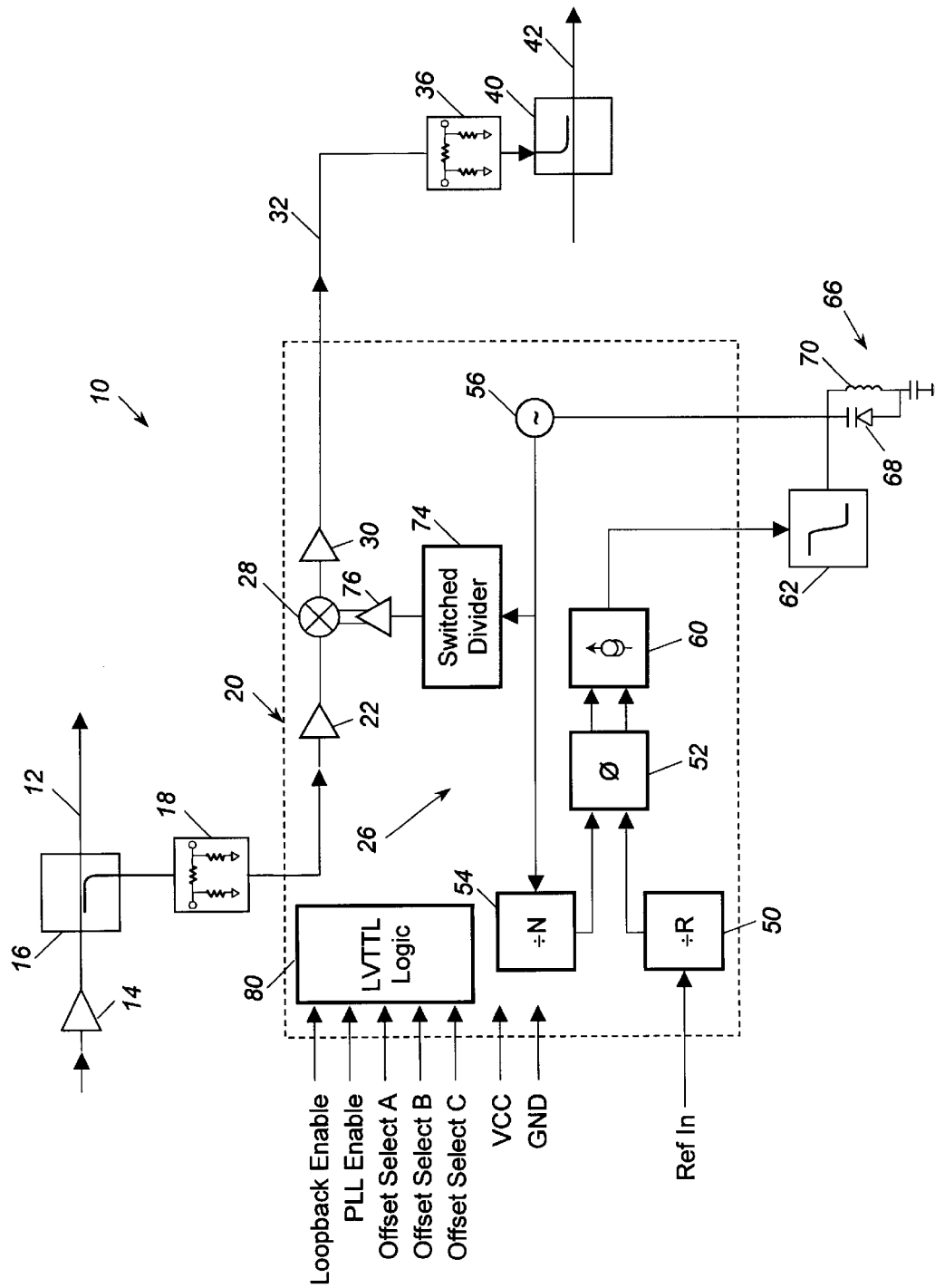
FIG. 1 is a schematic block diagram of a loop-back self-test circuit for a cellular base station, according to an embodiment of the present invention.

FIG. 1 is a schematic block diagram of a loop-back self-test circuit 10 for use in a cellular base station, according to an embodiment of the present invention. The self-test circuit 10 converts the frequency of a transmit signal to the frequency of a receive signal for that system so that the transmit signal can be tested in the receiver. The frequency bands for the transmit and receive signals in a cellular telephone system are typically between 800–2000 MHz, and typically have an offset between the transmit and receive frequencies of 95, 90, 80, 45 or 40 MHz.

A cellular telephone signal to be transmitted by the cellular base station is provided on a transmit line 12, amplified to the desired power level by a power amplifier 14 and transmitted by an antenna (not shown). Transmitter circuitry generates and modulates the transmit signal at the desired frequency and coding. The transmitter circuitry can be any suitable circuitry for this type of system and need not be shown for a proper understanding of the invention. During a test, a portion of the transmit signal on the line 12 is coupled therefrom by a coupler 16 to be directed to the self-test circuit 10. Because the transmit signal is at relatively high power, the coupled portion of the signal is reduced in power by an attenuator 18 so that it doesn't damage components in the circuit 10.

The attenuated signal from the attenuator 18 is applied to a differential amplifier 22 mounted on an integrated circuit chip 20 to amplify the signal. A differential signal is a signal that is split into two parts that are 180° out of phase with each other and combine to form the complete signal. As is known in the art, differential signals are sometimes generated in communications systems of this type to provide greater noise immunity. The differential signal from the amplifier 22 is then applied to a mixer 28, such as a Gilbert mixer, star mixer, ring mixer, etc., that mixes the transmit signal with a local oscillator (LO) signal for down-conversion purposes to convert the higher frequency transmit signal to the lower frequency of the receive signal for subsequent demodulation and analysis in the receiver. The LO signal is generated by a synthesizer or a phase lock loop (PLL) 26 that will be discussed in detail below.

The down-converted signal from the mixer 28, now at the receive frequency, is applied to a differential amplifier 30 that generates differential signals on a receiver line 32. The receiver signal on the line 32 is applied to an attenuator 36 to reduce the power level of the signal to a level compatible with receiver sensitivities. The attenuated signal from the attenuator 36 is applied to a coupler 40 that couples the signal onto a receiver channel 42. Subsequently, the signals are demodulated and analyzed to determine that the signal being transmitted is the desired one for diagnostics purposes.

In order to generate the LO signal, a clock reference frequency signal is applied to a divider circuit 50 formed on the chip 20. In one embodiment, the reference frequency is 52 MHz, and the divider circuit 50 divides it by 52 to generate a 1 MHz signal. However, this is application specific, in that other designs may employ other reference frequencies and divide values. The divided frequency signal from the divider 50 is applied to a digital phase comparator 52 in the PLL 26. The phase comparator 52 also receives an input signal from an LO divider circuit 54 on the chip 20. The divider circuit 54 divides a frequency signal from a voltage controlled oscillator (VCO) 56. The VCO 56 generates the LO signal that is converted to the desired frequency and is locked to a desired phase by the PLL 26. In one embodiment, the VCO 56 generates a 80–95 MHz frequency signal, and the divider circuit 54 divides the VCO signal by one of 80, 90 or 95 to generate a 1 MHz frequency signal. However, as will be appreciated by those skilled in the art, these values are by way of a non-limiting example in that other systems may require other frequencies within the scope of the present invention.

The phase comparator 52 generates two differential signals that indicate a phase error representative of the phase difference between the frequency signals from the divider circuits 50 and 54. Each phase error signal is a time varying pulse, where the width of the pulse is the degree of phase difference. One phase error signal from the phase comparator 52 is a "pump up" signal and the other phase error signal is a "pump down" signal indicating whether the divided LO frequency signal from the divider circuit 54 is lagging or leading the divided reference frequency signal from the divider circuit 50. The phase comparator 52 can be any phase comparator or phase detector suitable for the purposes discussed herein.

The pump up error signal and the pump down error signal are applied to a charge pump circuit 60. The charge pump circuit 60 provides an output signal that sets the voltage potential applied to the VCO 56 to change the VCO frequency signal so that it is in phase with the reference frequency signal. According to one embodiment of the invention, the charge pump circuit 60 provides a sink current or a source current to control the voltage applied to the VCO 56. According to the invention, the charge pump circuit 60 has a design that allows it to be integrated onto the chip 20 for a lower cost and reduced size than conventional charge pumps circuits known in the art. Further, the charge pump circuit 60 uses less voltage than those charge pump circuits known in the art. The charge pump circuit 60 can be any charge pump device suitable for the purposes described herein. One example of a suitable charge pump circuit will be discussed below with reference to FIG. 2.

The signal from the charge pump circuit 60 is applied to a loop filter 62 to filter the signal to be within the desirable frequency range for noise suppression purposes. The loop filter 62 acts as an integrator to convert the charge pump output current to a voltage signal. The filtered signal from the loop filter 62 is applied to a tank circuit 66 including a varactor diode 68 and an inductor 70, where the diode 68 acts as a variable capacitor. The tank circuit 66 resonates at a particular frequency depending on the voltage from the loop filter 62. The capacitor in the diode 68 generates a voltage potential that is applied to the VCO 56. Thus, the error signal applied to the charge pump circuit 60 determines the voltage on the varactor diode 68 that sets the VCO 56 output frequency. The loop filter 62 is not provided on the chip 20 to provide better filter flexibility, and the varactor diode 68 and the inductor 70 are not provided on the chip 20 because they are too bulky at these frequencies. Other types of tunable circuits can be used instead of a tank circuit within the scope of the present invention.

The frequency signal from the VCO 56 is applied to a switched divider circuit 74 that divides the VCO signal to the desired LO frequency. The switched divider circuit 74 provides the desired offset between the transmit and receive frequencies based on the frequency of the VCO 56, and is usually a divide-by-one or a divide-by-two divider. The LO signal from the switched divider circuit 74 is applied to a differential amplifier 76 that amplifies and converts it to a differential signal that is applied to the mixer 28 as the LO signal. The switched divider circuit 74 can be any divider circuit suitable for the purposes described herein.

The self-test circuit 10 is controlled by a system processor (not shown). The processor provides enable and select signals to a low voltage transistor-transistor logic (LVTTL) circuit 80 to control the operation of the circuit 10. Typically, the processor waits for a time window to provide a diagnostics check when the receiver is not processing received calls. When such a suitable time frame exists, the processor provides a loop-back enable power signal and a PLL enable power signal to the circuit 80 to power up the components on the chip 20. Further, offset select signals A, B and C are provided to the circuit 80 to determine the divide ratio of the divider circuit 54 and the switched divider circuit 74 to provide the required offset between the transmit and receive frequencies. Therefore, the circuit 10 is adaptable to be used for cellular telephone base stations operating at different frequencies.

Figure 2:
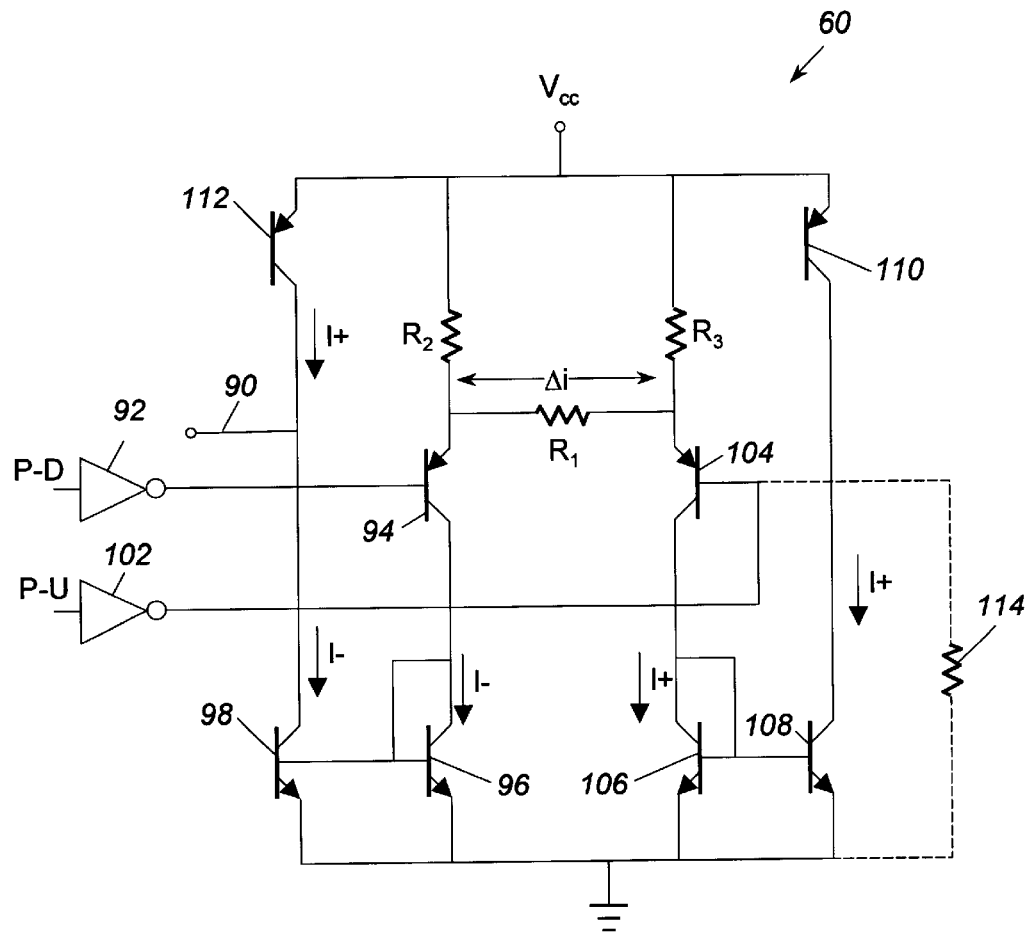
FIG. 2 is a schematic diagram of a charge pump circuit for a PLL associated with the self-test circuit shown in FIG. 1, according to an embodiment of the present invention.

As discussed above, the phase comparator 52 outputs two differential error signals to the charge pump circuit 60 that provide an indication of the phase difference between the divided VCO signal and the divided reference signal. In one embodiment, these signals cause the charge pump circuit 60 to either provide source current (pump up) or sink current (pump down) to or from the loop filter 62. FIG. 2 is a schematic diagram of the charge pump circuit 60 to depict how it generates the source current for the pump up (P-U) signal and the sink current for the pump down (P-D) signal. When the P-D input signal is a logic 1, current flows in to (sink) the charge pump circuit 60, and when P-U input signal is a logic 1, current flows out of (source) the charge pump circuit 60. When both of the P-D and P-U input signals from the phase comparator 52 are a logic 0, the output current of the charge pump circuit 60 is zero. The phase comparator 52 prevents both P-D and P-U from being a logic 1. The state diagram for the charge pump circuit 60 is given below in table I.

TABLE I

| State | P-D | P-U | Output |
|---|---|---|---|
| A | 0 | 0 | 0 |
| B | 0 | 1 | I+ |
| C | 1 | 0 | I− |
| D | 1 | 1 | 0 |

The charge pump circuit 60 works as a bi-directional constant current source by sourcing or sinking up to 500 µA. The charge pump circuit 60 is a rail-to-rail charge pump device because it operates over the full voltage swing of the supply voltage to ground. In one embodiment, the charge pump circuit 60 operates in a 100 MHz loop frequency range. The charge pump circuit 60 can be implemented as a cell on a single integrated circuit and still drive the highly capacitive load of the loop filter 62. As will become apparent from the discussion below, the charge pump circuit 60 is able to provide these features because it is based on complimentary bipolar transistor pairs.

When the circuit 60 is in the pump down condition, where P-D is a logic 1 and P-U is a logic 0, current flows into the charge pump circuit 60 on an output line 90 to remove charge from the capacitor in the diode 68. When the circuit 60 is in the pump up condition, where P-U is a logic 1 and P-D is a logic 0, current flows out of the output line 90 to add charge to the capacitor in the diode 68. When both P-D and P-U are both logic 0, no current flows into or out of the charge pump circuit 60. Current flow in the I+ direction represents current flow out of the output line 90, and current flow in the I− direction represents current flow in to the output line 90.

A voltage potential is provided to $V_{CC}$, 4.2 volts in one embodiment, to generate a current flow through the circuit 60 set by divider resistors $R_1$, $R_2$ and $R_3$. The P-D signal is applied to an inverter 92 that inverts the signal and sets a fixed low voltage signal. The low voltage signal is applied to a base terminal of a PNP bipolar transistor 94. Therefore, the transistor 94 conducts, drawing current into its emitter terminal through the resistors $R_1$, $R_2$ and $R_3$ and out of its collector terminal. The collector terminal of the transistor 94 is coupled to the base terminal and collector terminal of a NPN bipolar transistor 96 so that current flow through the transistor 94 turns on the transistor 96. Current flows into the collector terminal of the transistor 96 and out of its emitter terminal to ground. The base terminal of the transistor 96 is coupled to the base terminal of an NPN bipolar transistor 98 so that when the transistor 96 conducts, the transistor 98 conducts, and the current flow through the transistor 96 is mirrored in the transistor 98. Thus, current flow from the collector terminal through the emitter terminal of the transistor 98 causes a sink current flow into the circuit 60 on the line 90.

The P-U signal is applied to an inverter 102 that inverts the signal and sets a fixed low voltage signal. The low voltage signal is applied to the base terminal of a PNP bipolar transistor 104. In this condition, P-D is a logic low so that the output of the inverter 92 is a logic high, the transistor 94 is off. When the transistor 104 conducts, the current from the resistors $R_1$, $R_2$ and $R_3$ flows into the emitter terminal of the transistor 104 and out of its collector terminal. The collector terminal of transistor 104 is coupled to the collector terminal and the base terminal of an NPN bipolar transistor 106 that causes it to conduct so that current flows into the collector terminal and out of the emitter terminal of the transistor 106. The base terminal of the transistor 106 is coupled to the base terminal of an NPN bipolar transistor 108 so that the current flow through the transistor 106 is mirrored as a current flow through the transistor 108.

The collector terminal of the transistor 108 is coupled to the collector terminal of a PNP bipolar transistor 110 so that when the transistor 108 conducts, the same amount of the current flows through transistor 110. The base terminal of the transistor 110 is coupled to the base terminal of a PNP bipolar transistor 112 so that the current flow through the transistor 110 is mirrored as a current flow through the transistor 112. Thus, a current flow from the emitter terminal through the collector terminal of the transistor 112 provides a source current to the output line 90. Only one of the transistors 98 or 112 conducts to provide the source current or sink current.

In order for the PLL 26 to operate properly, there must always be a constant phase comparator gain $K_\phi$. If the phase difference between the two signals is so close that the P-D or P-U error pulse is very narrow, then the electronics of the charge pump circuit 60 cannot react fast enough to provide a constant source or sink current to the loop filter 62. However, this is the condition that the charge pump circuit 60 is attempting to obtain. Therefore, to maintain a PLL constant loop gain, the charge pump circuit 60 must always be providing one or the other of the source current or the sink current.

To provide this function, an external bleed resistor 114 is coupled to the base terminal of the transistor 104. Therefore, if and when the condition ever occurs where the phase between the divided down VCO signal and the reference signal is so close, there will always be a small phase error signal output from either of the inverters 92 or 102 that is too narrow of a pulse. The current draw provided by the resistor 114 causes the transistor 104 to barely conduct so that the charge pump circuit 60 is in the pump up condition. This causes the phase difference between the divided down VCO signal and the reference signal to increase, which in turn causes the charge pump circuit 60 to draw current from the loop filter 62. In an alternate embodiment, the bleed resistor 114 can be coupled to the base terminal of the transistor 94 to provide the same function.

Figure 3:
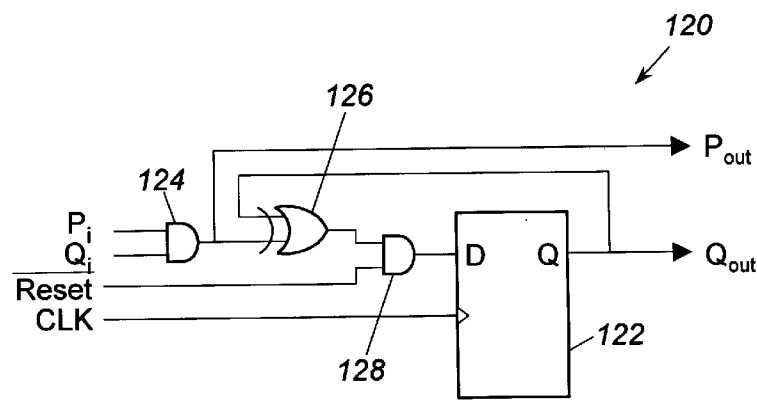
FIG. 3 is a schematic diagram of a synchronous divide-by-two circuit that can be used in the self-test circuit shown in FIG. 1, according to an embodiment of the present invention.

As discussed herein, the self-test circuit 10 employs components on the chip 20 that are low cost and compact. To further accomplish this, a cascadable synchronous divide-by-two counter circuit 120 is used as a building block in each of the divider circuits 50 and 54, and the switched divider circuit 74, according to an embodiment of the present invention. FIG. 3 is a schematic diagram of the counter circuit 120. As will be discussed in detail below, the circuit 120 is one binary unit that outputs a logic 1 or a logic 0. The circuit 120 is combined with other counter circuits to provide the complete counter or divider. The circuit 120 includes $P_i$ and $Q_i$ inputs, where $Q_i$ is an output of a preceding circuit and $P_i$ is the state of all of the preceding circuits. For the first circuit in the cascaded series, $P_i$ and $Q_i$ would be high or a logic 1.

The core of the circuit 120 is a D flip-flop 122. The flip-flop 122 outputs $Q_{out}$ that is the $Q_i$ for the next circuit in the cascade. A clock transition input to the flip-flop 122 causes the flip-flop 122 to output the digital bit at input D for each clock cycle. In the embodiment discussed above, the clock signal is 52 MHz. The $P_i$ and $Q_i$ signals are applied to an AND gate 124. The output of the AND gate 124 is $P_{out}$ for the circuit 120 and is a logic high only when the inputs $P_i$ and $Q_i$ are a logic high. $P_i$ is only a logic high if $P_{out}$ for all of the preceding circuits in the cascade are high.

The output of the AND gate 124 and the $Q_{out}$ signal from the flip-flop 122 are applied to an exclusive-OR gate 126. The output of the exclusive-OR gate 126 is a logic high only when the inputs are not the same, i.e., one is a logic 1 and the other is a logic 0. The output of the exclusive-OR gate 126 is one input to another AND gate 128. The other input of the AND gate 128 is a reset bit that resets the entire cascade to zero each time the desired count is reached. The reset bit is high when the circuit 120 is counting and is switched to low to reset the output of the flip-flop 122 to zero. When the output of the AND gate 124 is a logic high, the flip-flop 122 is toggled and switched to Not $Q_{out}$ at the next clock cycle. Thus, the circuit 120 acts as a binary counter. The state diagram for the circuit 120 is given below in Table II.

TABLE II

| Reset | $P_{in}$ | $Q_{in}$ | $Q_{n+1}$ |
|---|---|---|---|
| 0 | X | X | 0 |
| 1 | 0 | 0 | $Q_n$ |
| 1 | 0 | 1 | $Q_n$ |
| 1 | 1 | 0 | $Q_n$ |
| 1 | 1 | 1 | Not $Q_n$ |

Figure 4:
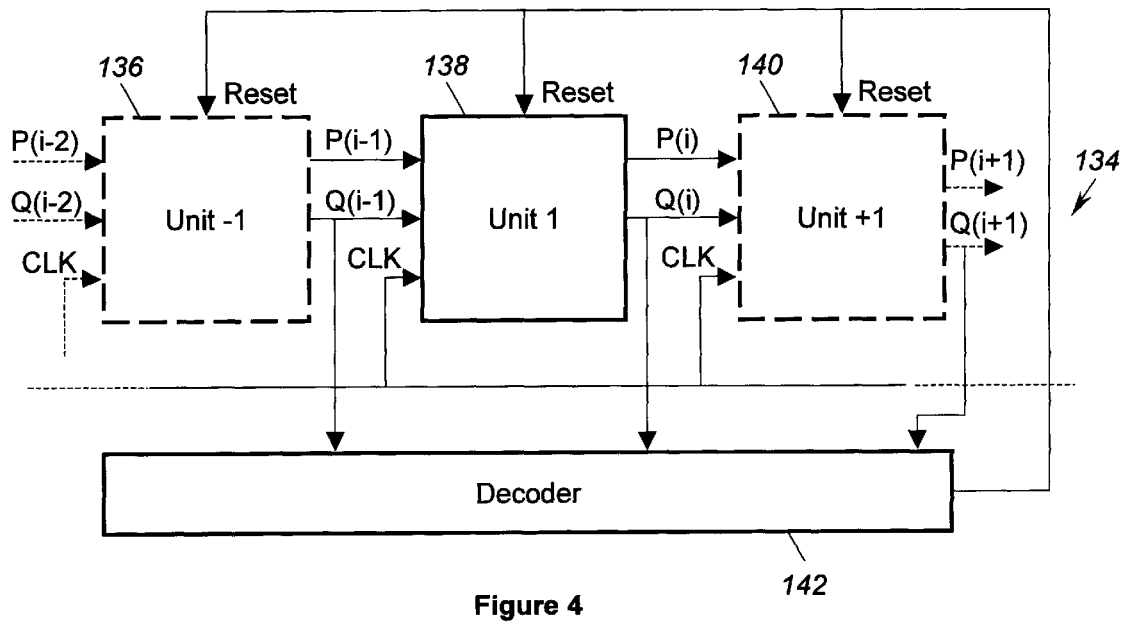
FIG. 4 is a block diagram of a series of cascaded divide-by-two circuits shown in FIG. 3, according to an embodiment of the present invention.

FIG. 4 is a schematic block diagram of a cascaded counter 134 made up of three consecutive counter units 136, 138 and 140. Each unit 136–140 is a replica of the counter circuit 120 discussed above. Each unit 136–140 inputs $P_i$ and $Q_i$, and outputs $P_i$ and $Q_i$. A clock signal is applied to each unit 136–140 that provides the counter clock. The units 136–140 are controlled by a decoder 142 that is programmed to reset each time the counter 134 reaches the desired state. When the counter 134 reaches the desired state, the decoder 142 provides a common reset signal to each of the units 136–140 to reset them to zero for the next count. Because each unit 136–140 is a binary counter, the total count for the cascaded counter 134 is $2^n$, where n is the number of units. For a three unit counter, the highest count is $2^3$ or 8. For the divider circuit 50 discussed above, six cascaded units would be required to provide the 52 count.

The AND gates 124 and 128, the exclusive-OR gate 126 and the flip-flop 122 can be any design suitable for the purposes described herein. One of normal skill in the art would readily recognize how several designs could vary and still accomplish the binary divide-by-two counter circuit 120. The present invention proposes employing heterojunction bipolar transistors in these various components to provide the design advantages discussed herein. Particularly, a bipolar transistor design is employed in these components to provide single chip mixed-signal design combining analog and digital signals, compact size, low cost, low power requirements, wide bandwidth, etc.

Figure 5:
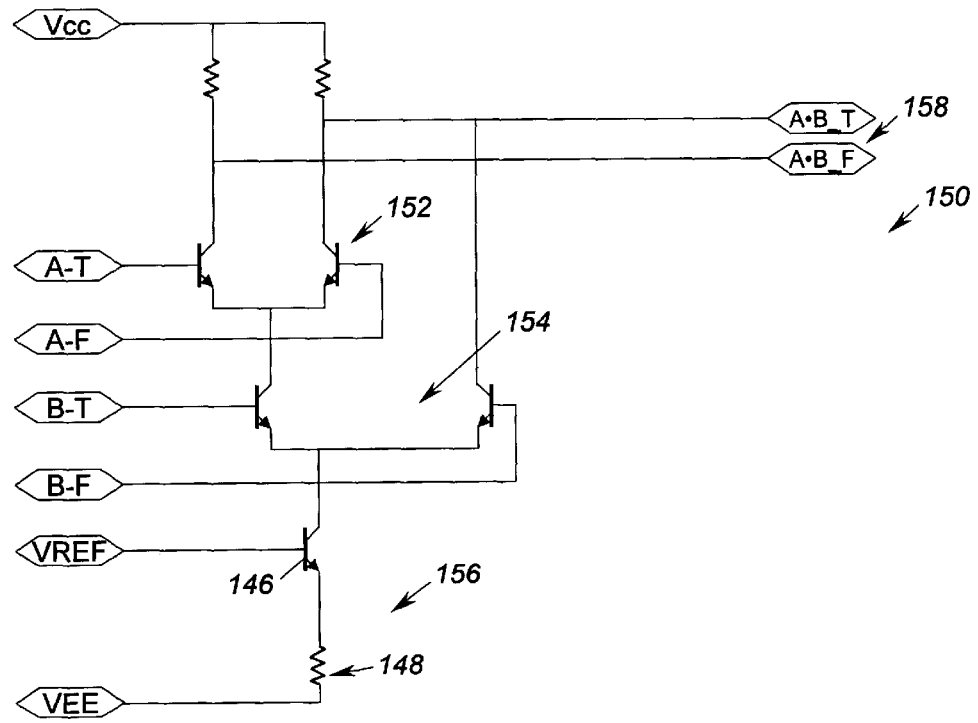
FIG. 5 is a schematic diagram of a two-input AND gate employed in the divide-by-two circuit shown in FIG. 3.

FIG. 5 is a schematic diagram of a two-input AND gate circuit 150 that can be used for the AND gates 124 and 128 consistent with the discussion herein. The AND gate circuit 150 includes a pair of bipolar transistors 152 receiving one differential input signal and a pair of bipolar transistors 154 receiving another differential input signal. A current source 156 employing a bipolar transistor 146 and a resistor 148 provides a source of current for the AND gate circuit 150. An output of the AND gate circuit 150 is provided on differential output lines 158.

Figure 6:
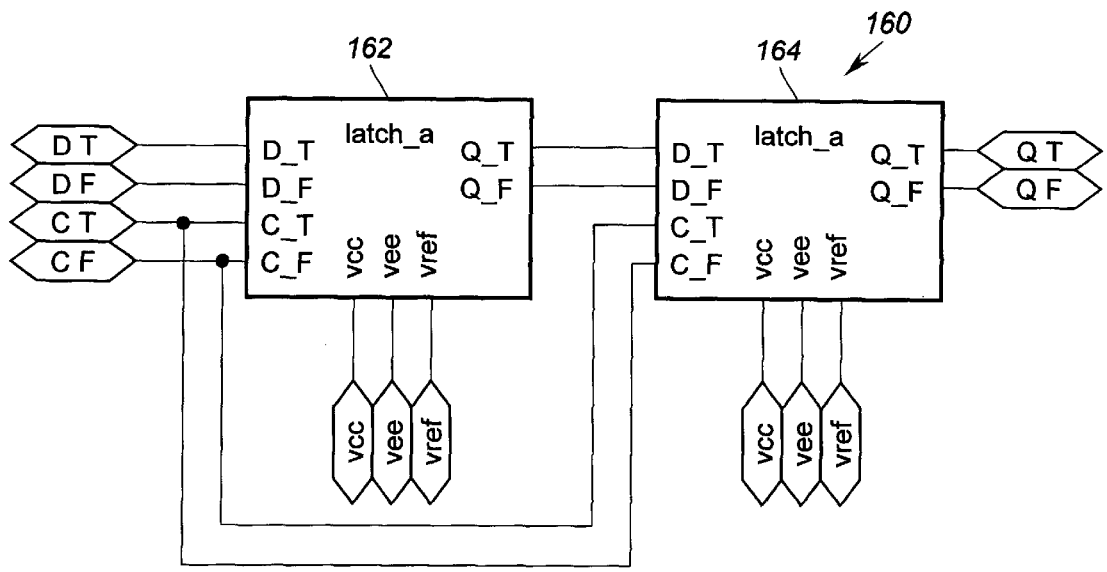
FIG. 6 is a schematic diagram of a D flip-flop employed in the divide-by-two circuit shown in FIG. 3.

FIG. 6 is a schematic diagram of a D flip-flop 160 that can be used for the flip-flop 122 discussed above. The flip-flop 160 employs latch circuits 162 and 164 responsive to differential input signals and outputting differential output signals, as shown.

Figure 7:
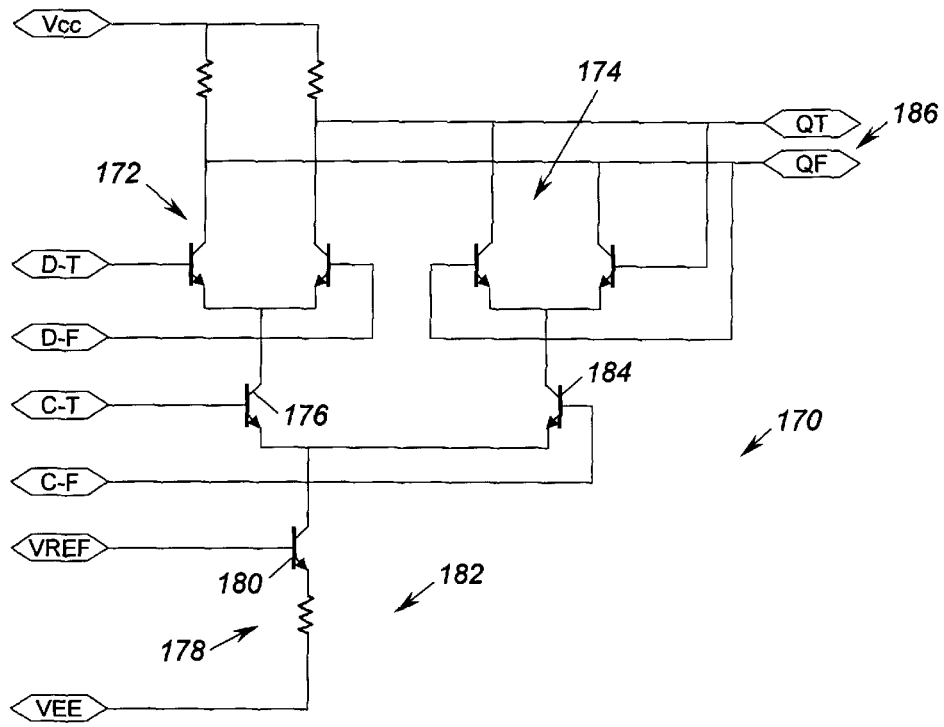
FIG. 7 is a schematic diagram of a latch employed in the D flip-flop shown in FIG. 6.

FIG. 7 is a schematic diagram of a latch circuit 170 suitable to be used for the latches 162 and 164 discussed above. The latch circuit 170 employs bipolar transistors having a design philosophy consistent with the discussion herein. A first differential input signal is applied to a pair of bipolar transistors 172, and a second differential input signal is applied to a pair of bipolar transistors 174. The latch circuit 170 includes a current source 178 having a bipolar transistor 180 and a resistor 182. A first control signal is applied to the base terminal of a bipolar transistor 176 and a second control signal is applied to the base terminal of a bipolar transistor 184 to control the current flow from the current source 178. The selected input signal is applied to differential output lines 186 based on the control signal.

Figure 8:
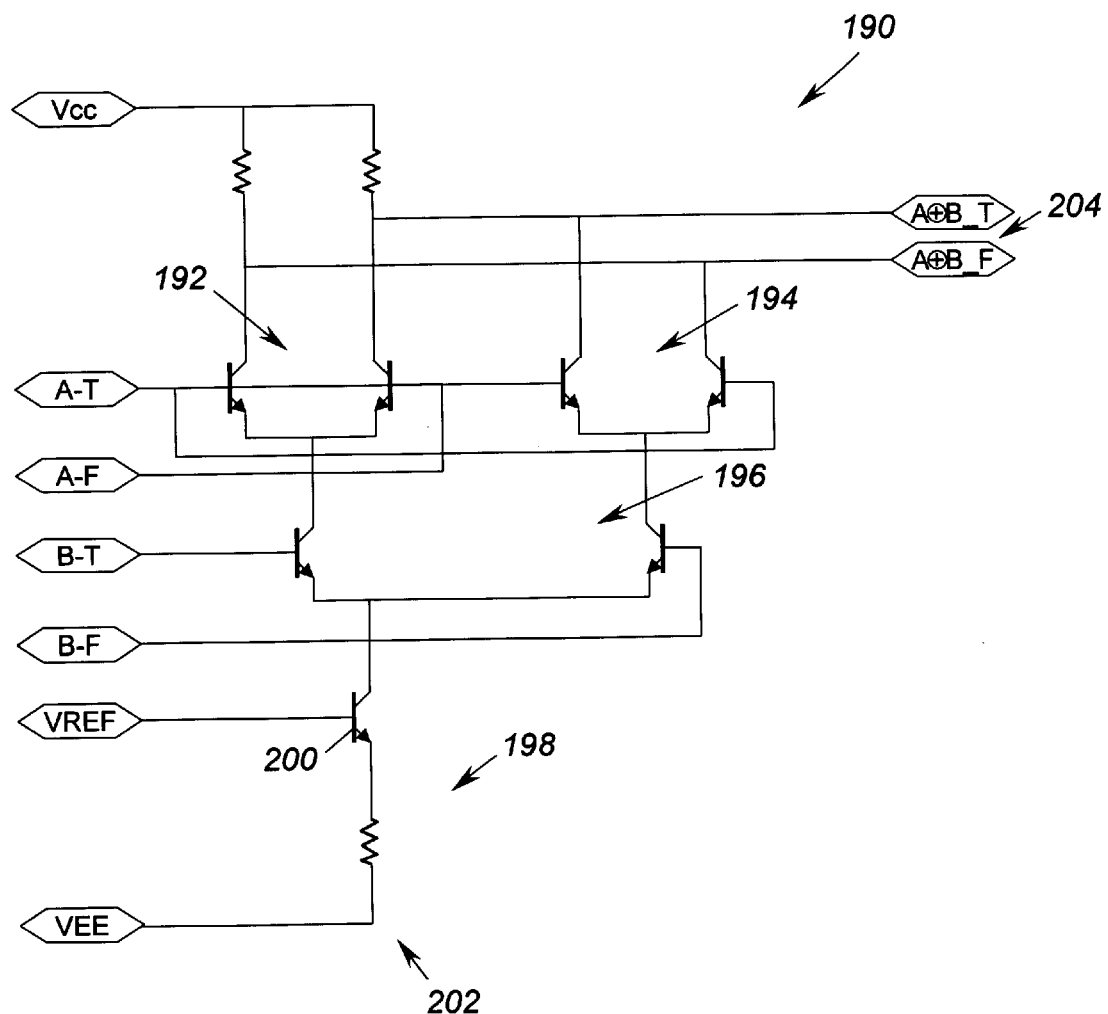
FIG. 8 is a schematic diagram of an exclusive-OR gate employed in the divide-by-two circuit shown in FIG. 3.

FIG. 8 is a schematic diagram of an exclusive-OR gate circuit 190 having a similar design as the latch circuit 170 discussed above. The exclusive-OR circuit 190 can be used as the exclusive-OR gate 126 discussed above. The circuit 190 receives a first differential input signal applied to the base terminal of a pair of bipolar transistors 192 and a pair of bipolar transistors 194. A second differential input signal is applied to a pair of bipolar transistors 196. A current source 198 including a bipolar transistor 200 and a resistor 202 provides a source of current for the circuit 190. A differential output of the circuit 190 is provided on differential output lines 204.

Figure 9:
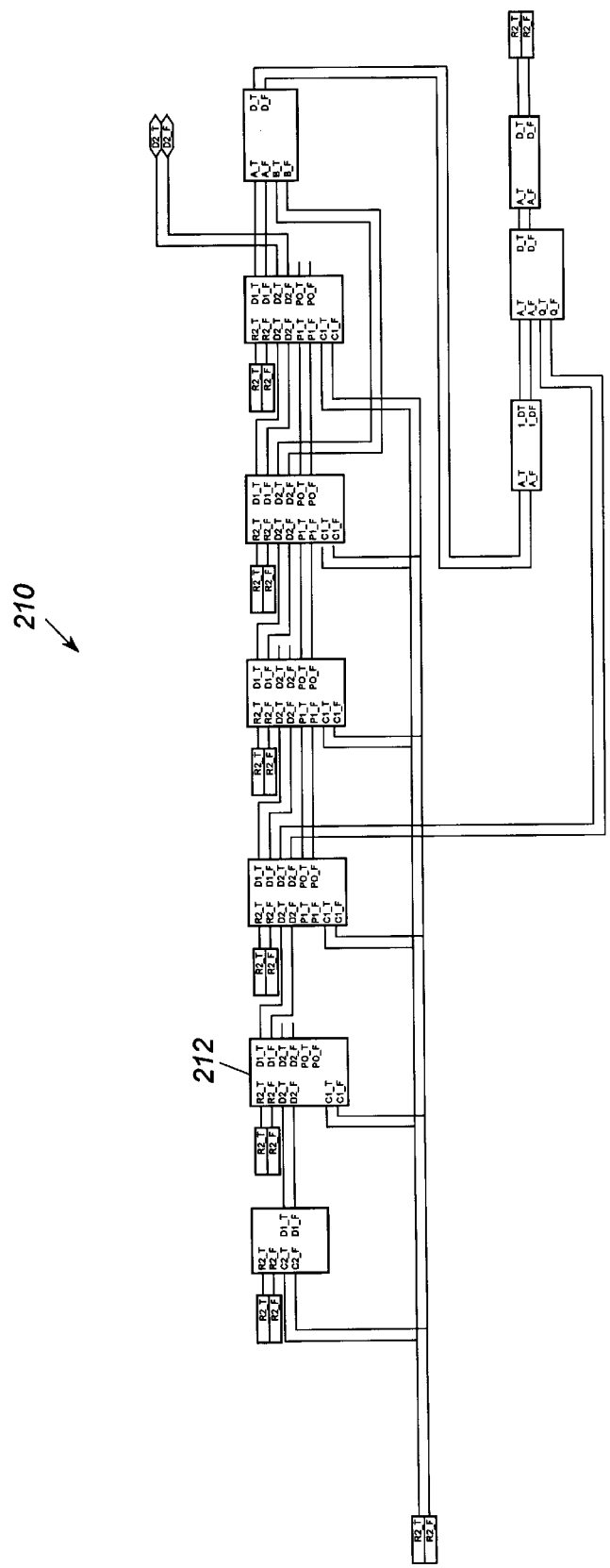
FIG. 9 is a schematic block diagram of a cascaded divide-by-52 counter for the self-test circuit shown in FIG. 1, according to an embodiment of the present invention.

FIG. 9 is a schematic block diagram of a counter 210 that can be used for the divider circuit 50 discussed above, and is based on the divide-by-two counter circuit 120. The counter 210 includes a plurality of units 212 each receiving differential P and Q input signals and outputting differential P and Q output signal. Each unit 212 is intended to represent a single one of the counter circuits 120.

The foregoing discussion discloses and describes merely exemplary embodiments of the present invention. One skilled in the art will readily recognize from such discussion and from the accompanying drawings and claims, that various changes, modifications and variations can be made therein without departing from the spirit and scope of the invention as defined in the following claims.

What is claimed is:

1. A divide-by-two counter circuit comprising:
    a first AND gate responsive to a first logic input and a second logic input, said first AND gate providing a logic output;
    an exclusive-OR gate responsive to the logic output from the first AND gate, said exclusive-OR gate providing a logic output;
    a second AND gate responsive to the logic output from the exclusive-OR gate and a logic reset signal, said second AND gate providing a logic output; and
    a flip-flop responsive to the logic output from the second AND gate, said flip-flop providing a logic output, wherein the exclusive-OR gate is responsive to the logic output from the flip-flop.

2. The counter circuit according to claim 1 wherein the first AND gate, the second AND gate, the exclusive-OR gate and the flip-flop each employ a plurality of bipolar transistors.

3. The counter circuit according to claim 1 wherein the flip-flop includes a first latch device and a second latch device.

4. The counter circuit according to claim 1 wherein the inputs and the outputs of the counter circuit are differential signals.

5. The counter circuit according to claim 1 wherein the counter circuit is one counter circuit of a plurality of cascaded counter circuits in a counter.

6. The counter circuit according to claim 5 wherein the output of the first AND gate is a logic high only if the outputs of the first AND gates of all of the preceding counter circuits are a logic high.

7. The counter circuit according to claim 1 wherein the counter circuit is part of a divider in a phase lock loop.

8. The counter circuit according to claim 7 wherein the phase lock loop is part of a loop-back self-test circuit.

9. A digital counter for providing a digital count, said counter including a cascaded series of binary counter units, each counter unit being responsive to a P input and a Q input and providing a P output and a Q output, where the Q input is the Q output of an immediately preceding unit and the P input is a state of all of the preceding units, each counter unit comprising:
    a first AND gate responsive to the P input and the Q input, said first AND gate providing the P output;
    an exclusive-OR gate responsive to the P output from the first AND gate, said exclusive-OR gate providing a logic output;
    a second AND gate responsive to the logic output from the exclusive-OR gate and a logic reset signal, said second AND gate providing a D output; and
    a flip-flop responsive to the D output from the second AND gate, said flip-flop providing the Q output, wherein the exclusive-OR gate is responsive to the Q output from the flip-flop.

10. The counter according to claim 9 further including a decoder, said decoder providing the reset signal to each counter unit when a predetermined count is reached.

11. The counter according to claim 9 wherein the first AND gate, the second AND gate, the exclusive-OR gate and the flip-flop each employ a plurality of bipolar transistors.

12. The counter according to claim 9 wherein the output of the first AND gate is a logic high only if the outputs of the first AND gates of all of the preceding counter units are a logic high.

13. The counter according to claim 9 wherein the inputs and the outputs of the counter units are differential signals.

14. The counter according to claim 9 wherein the counter is part of a divider in a phase lock loop.

15. The counter according to claim 14 wherein the phase lock loop is part of a loop-back self-test circuit.

16. A digital counter for providing a digital count, said counter including a cascaded series of binary counter units that each provide a digital count, each counter unit being responsive to a first input and a second input and providing a first output and a second output, where the first input of a particular counter unit in the series of counter units is the first output of an immediately preceding counter unit in the series of counter units and the second input of the particular counter unit is a state of all of the preceding counter units in the series of counter units, each counter unit comprising a plurality of digital devices where each digital device employs a plurality of bipolar transistors.

17. The counter according to claim 16 further including a decoder, said decoder providing a reset signal to each counter unit when a predetermined count is reached.

18. The counter according to claim 16 wherein the inputs and the outputs of the counter units are differential signals.

19. The counter according to claim 16 wherein the state of a counter unit is the second output of the counter unit being a logic high.

20. The counter according to claim 16 wherein the counter is part of a divider in a phase lock loop.

\* \* \* \* \*